United States Patent
Yamazaki et al.

(10) Patent No.: US 7,183,696 B2
(45) Date of Patent: Feb. 27, 2007

(54) THIN FILM PIEZOELECTRIC ELEMENT, SUSPENSION ASSEMBLY, AND HARD DISK DRIVE

(75) Inventors: Hiroshi Yamazaki, Tokyo (JP); Ken Unno, Tokyo (JP); Kenichi Tochi, Tokyo (JP); Masahiro Miyazaki, Tokyo (JP); Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 127 days.

(21) Appl. No.: 11/054,427

(22) Filed: Feb. 10, 2005

(65) Prior Publication Data

US 2005/0200237 A1    Sep. 15, 2005

(30) Foreign Application Priority Data

Mar. 15, 2004   (JP) .............................. 2004-072989

(51) Int. Cl.
*H01L 41/08* (2006.01)
(52) U.S. Cl. .................. 310/328; 310/330; 310/332
(58) Field of Classification Search ................ 310/328, 310/330–332, 340
See application file for complete search history.

(56) References Cited

U.S. PATENT DOCUMENTS

| | | | | |
|---|---|---|---|---|
| 2,266,768 | A * | 12/1941 | Otto ............................ | 310/340 |
| 6,617,762 | B2 * | 9/2003 | Kurano et al. ............... | 310/328 |
| 6,661,158 | B2 * | 12/2003 | Kawazoe ...................... | 310/328 |
| 6,741,012 | B2 * | 5/2004 | Koganezawa et al. ...... | 310/328 |
| 6,781,286 | B2 * | 8/2004 | Ogawa et al. ............... | 310/333 |
| 6,785,096 | B2 | 8/2004 | Kuwajima et al. | |
| 6,817,073 | B2 * | 11/2004 | Uchiyama et al. ......... | 29/25.35 |
| 6,903,491 | B2 * | 6/2005 | Irie et al. ..................... | 310/328 |
| 6,949,869 | B2 * | 9/2005 | Junhua et al. ............... | 310/328 |
| 2001/0021086 | A1 | 9/2001 | Kuwajima et al. | |
| 2003/0179697 | A1 | 9/2003 | Kuwajima et al. | |
| 2004/0095663 | A1 | 5/2004 | Kuwajima et al. | |
| 2004/0095685 | A1 | 5/2004 | Kuwajima et al. | |
| 2004/0095686 | A1 | 5/2004 | Huwajima et al. | |
| 2004/0100736 | A1 | 5/2004 | Kuwajima et al. | |

FOREIGN PATENT DOCUMENTS

JP    A-2002-134807    5/2002
JP    A-2002-203384    7/2002

* cited by examiner

*Primary Examiner*—Mark Budd
(74) *Attorney, Agent, or Firm*—Oliff and Berridge, PLC

(57) ABSTRACT

A thin film piezoelectric element has a laminate including a piezoelectric film and a pair of electrode films placed so as to sandwich the piezoelectric film in between, a resin film formed so as to cover the laminate, and an electrode formed on the resin film and electrically connected to the electrode film. The resin film is formed so that a thickness of a region where the electrode is formed is larger than a thickness of a region corresponding to a displaced portion of the laminate.

6 Claims, 14 Drawing Sheets

THIN FILM PIEZOELECTRIC ELEMENT, SUSPENSION ASSEMBLY, AND HARD DISK DRIVE

BACKGROUND OF THE INVENTION

1. Field of the Invention

The present invention relates to a thin film piezoelectric element, a suspension assembly, and a hard disk drive.

2. Related Background Art

A thin film magnetic head for recording and reproducing magnetic information in and from a recording medium such as a hard disk is formed in a so-called head slider. This head slider is mounted on a tip region of a suspension assembly, thereby constructing a head gimbal assembly (HGA). In general, this suspension assembly is constructed by placing a flexible flexure over a load beam of stainless steel or the like, and read/write wires of the thin film magnetic head are provided on the flexure. The base end side of this suspension assembly is coupled to an actuator arm driven by a voice coil motor (VCM). A VCM coil or the like is attached to the interconnected structure of the suspension assembly and the actuator arm, thereby constructing a so-called head stack assembly (HSA).

With recent tendencies toward higher recording densities of hard disks, particularly, toward narrower track widths, there are demands for a technology of driving the head slider by a small amount with high accuracy. There was thus a conventional proposal of the head gimbal assembly in which a thin film piezoelectric element making use of a piezoelectric element was placed at the interconnected part between the suspension assembly and the actuator arm, as described in Japanese Patent Application Laid-Open No. 2002-134807. This is a so-called two step motion type assembly, in which the first step is to control relatively large movement of the thin film magnetic head by drive of the actuator arm by the voice coil motor and in which the second step is to control fine movement such as tracking compensation by drive of the suspension assembly by the thin film piezoelectric element.

In the head gimbal assembly of this two step motion type as described above, however, the whole of the long suspension assembly needs to be driven by the thin film piezoelectric element, and there was thus a limit to achievement of higher accuracy of tracking. For this reason, there is another proposal of an apparatus in which the thin film piezoelectric element is placed between the head slider and the suspension assembly, for example, as disclosed in Japanese Patent Application Laid-Open No. 2002-203384. In this apparatus, the thin film piezoelectric element does not have to drive the long suspension assembly itself, but is able to directly drive the head slider, thus achieving higher-accuracy tracking.

The thin film piezoelectric element disclosed in Japanese Patent Application Laid-Open No. 2002-203384 has a laminate including a piezoelectric film, and a pair of electrode films placed so as to sandwich the piezoelectric film in between. Furthermore, this thin film piezoelectric element has a resin film formed so as to cover the laminate, and an electrode formed on the resin film and electrically connected to the electrode film.

SUMMARY OF THE INVENTION

However, the above conventional thin film piezoelectric element had the following problems. If the thickness of the resin film is too large, it will impede displacement of the laminate (piezoelectric film) to bring about the possibility of deterioration of piezoelectricity, and the laminate can warp due to stress during curing of the resin film. On the other hand, if the thickness of the resin film is too small, insulation failure can occur between the electrode film and the electrode.

An object of the present invention is to provide a thin film piezoelectric element, a suspension assembly, and a hard disk drive capable of suppressing occurrence of the insulation failure between the electrode film and the electrode, without deterioration of piezoelectricity.

A thin film piezoelectric element according to the present invention is a thin film piezoelectric element comprising: a laminate comprising a piezoelectric film, and a pair of electrode films placed so as to sandwich the piezoelectric film in between; a resin film formed so as to cover the laminate; and an electrode formed on the resin film and electrically connected to one of the electrode films, wherein the resin film is formed so that a thickness of a region where the electrode is formed is larger than a thickness of a region corresponding to a displaced portion of the laminate.

In addition, a suspension assembly according to the present invention is a suspension assembly on which a head slider having a thin film magnetic head is to be mounted, the suspension assembly comprising a thin film piezoelectric element for displacing the head slider relative to the suspension assembly, wherein the thin film piezoelectric element comprises: a laminate comprising a piezoelectric film, and a pair of electrode films placed so as to sandwich the piezoelectric film in between; a resin film formed so as to cover the laminate; and an electrode formed on the resin film and electrically connected to one of the electrode films, and wherein the resin film is formed so that a thickness of a region where the electrode is formed is larger than a thickness of a region corresponding to a displaced portion of the laminate.

Furthermore, a hard disk drive according to the present invention is a hard disk drive comprising a recording medium, a head slider having a thin film magnetic head for carrying out at least one of recording and reproduction with the recording medium, and a suspension assembly on which the head slider is mounted, wherein the suspension assembly comprises a thin film piezoelectric element for displacing the head slider relative to the suspension assembly, wherein the thin film piezoelectric element comprises: a laminate comprising a piezoelectric film, and a pair of electrode films placed so as to sandwich the piezoelectric film in between; a resin film formed so as to cover the laminate; and an electrode formed on the resin film and electrically connected to one of the electrode films, and wherein the resin film is formed so that a thickness of a region where the electrode is formed is larger than a thickness of a region corresponding to a displaced portion of the laminate.

In each of these thin film piezoelectric element, suspension assembly, and hard disk drive according to the present invention, the thickness of the region where the electrode is formed in the resin film is larger than the thickness of the region corresponding to the displaced portion of the laminate, whereby the space between the electrode film and the electrode becomes relatively large, so as to suppress occurrence of the insulation failure between the electrode film and the electrode. Since the thickness of the region corresponding to the displaced portion of the laminate in the resin film is smaller than the thickness of the region where the electrode is formed, the displacement of the laminate (piezoelectric film) is not impeded, whereby the deterioration of piezoelectricity can be suppressed. In addition, it is also feasible to suppress the warpage of the laminate.

Preferably, the resin layer comprises a first resin film formed so as to cover the laminate, and a second resin film formed in the region where the electrode is formed. In this case, it is extremely easy to form the resin film in which the thickness of the region where the electrode is formed is larger than the thickness of the region corresponding to the displaced portion of the laminate.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. Identical elements or elements having identical functions will be denoted by the same reference symbols throughout the description, without redundant description.

Figure 1:
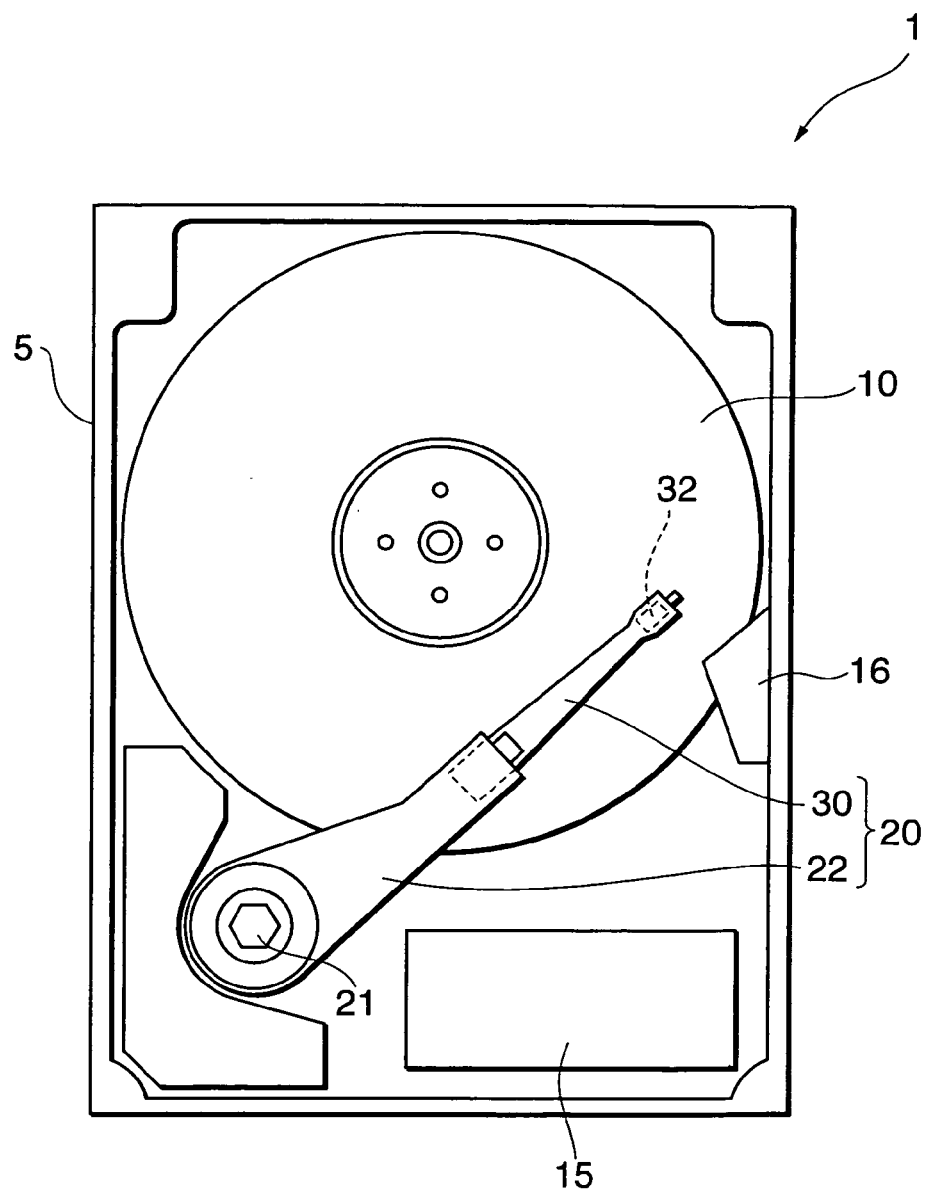
FIG. 1 is an illustration showing a hard disk drive in an embodiment of the present invention.

FIG. 1 is a schematic configuration diagram showing a hard disk drive in an embodiment of the present invention. The hard disk drive 1 has a hard disk 10 as a recording medium, and a head stack assembly (HSA) 20 for recording and reproducing magnetic information onto and from the hard disk 10, in a case 5. The hard disk 10 is arranged to be rotated by an unrepresented motor. Furthermore, the hard disk drive 1 incorporates a controller 15 for performing various controls such as recording and reproduction of information onto and from the hard disk 10, and a ramp mechanism 16 for setting a thin film magnetic head back from the position above the hard disk 10.

The head stack assembly 20 consists of a stack of plural assemblies stacked in the depth direction of the drawing, each assembly consisting of an actuator arm 22 supported rotatably about an axis 21 by a voice coil motor (VCM), and a head gimbal assembly (hereinafter referred to as "HGA") 30 connected to this actuator arm 22. A head slider 32 is mounted on the HGA 30 so as to face the hard disk 10.

The HGA 30 adopts the mode of moving the thin film magnetic head 31 in two steps, and a thin film piezoelectric actuator 70 is provided in order to implement this mode. The thin film piezoelectric actuator 70 is an actuator for displacing the head slider 32 relative to a support beam portion 50. Relatively large movement of the thin film magnetic head is controlled by driving of the whole of suspension assembly 40 and actuator arm 22 by the voice coil motor. Fine movement of the thin film magnetic head is controlled by driving of the head slider 32 by the thin film piezoelectric actuator 70.

Figure 3:
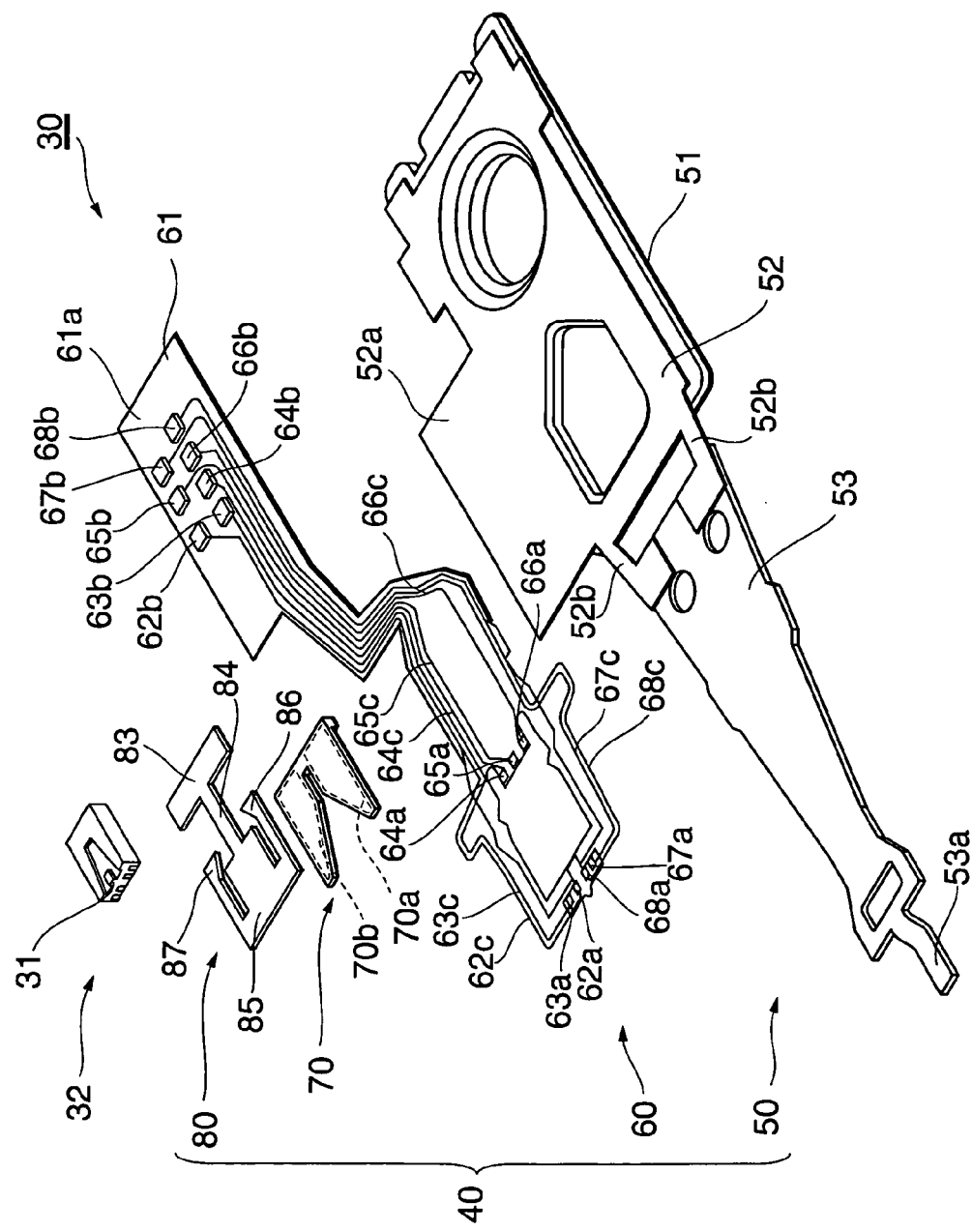
FIG. 3 is an exploded perspective view of the HGA.

The suspension assembly 40 has a support beam portion 50, a flexure 60, a thin film piezoelectric actuator 70 as a thin film piezoelectric element, and a transfer plate 80. The support beam portion 50 is comprised of a base plate 51, a connection plate 52 attached thereto, and a load beam 53. The connection plate 52 is thinner and more flexible than the base plate. The connection plate 52 is constructed with a projection 52a of rectangular shape projecting laterally, and a pair of connection pieces 52b, 52b extending apart from each other, as shown in FIG. 3. The load beam 53 is swingably coupled to each of the connection pieces 52b, 52b. The distal end of the load beam 53 is formed as a tab 53a which is arranged to slide up a slope during a receding operation of the head slider 32 to the ramp mechanism 16. The side opposite to the side where the load beam 53 is provided, in the base plate 51, is the side where the base plate is connected to the actuator arm 22. The connection plate 52 and the load beam 53 may be integrally formed.

The flexure 60 has a flexible wiring substrate 61 made of a polyimide resin or the like. A support plate of thin plate shape (not shown) made of stainless steel or the like is attached in part to the bottom surface of the flexure 60. The flexure 60 is bonded to the support beam portion 50 by laser spot welding. The wiring substrate 61 has a pad mount region 61a on the rear end side thereof. The pad mount region 61a is to be laid on the projection 52a of the connection plate 52.

Electrodes 62b, 63b for recording, electrodes 64b–66b for the piezoelectric actuator, and electrodes 67b, 68b for reproduction are mounted on the pad mount region 61a of the flexure 60. On the other hand, as shown in the enlarged view of FIG. 4, four electrodes 62a, 63a, 67a, and 68a are arrayed at the tip of the flexure 60. In addition, three electrodes 64a–66a are arranged behind the four electrodes 62a, 63a, 67a, and 68a of the flexure 60. The electrodes 62a–68a are electrically connected through respective wires 62c–68c to the electrodes 62b–68b, respectively. Each wire 62c–68c is coated with an insulating film in practice. The wires 62c–68c on the wiring substrate 61 can be formed, for example, by a film-forming technique such as plating.

Figure 2:
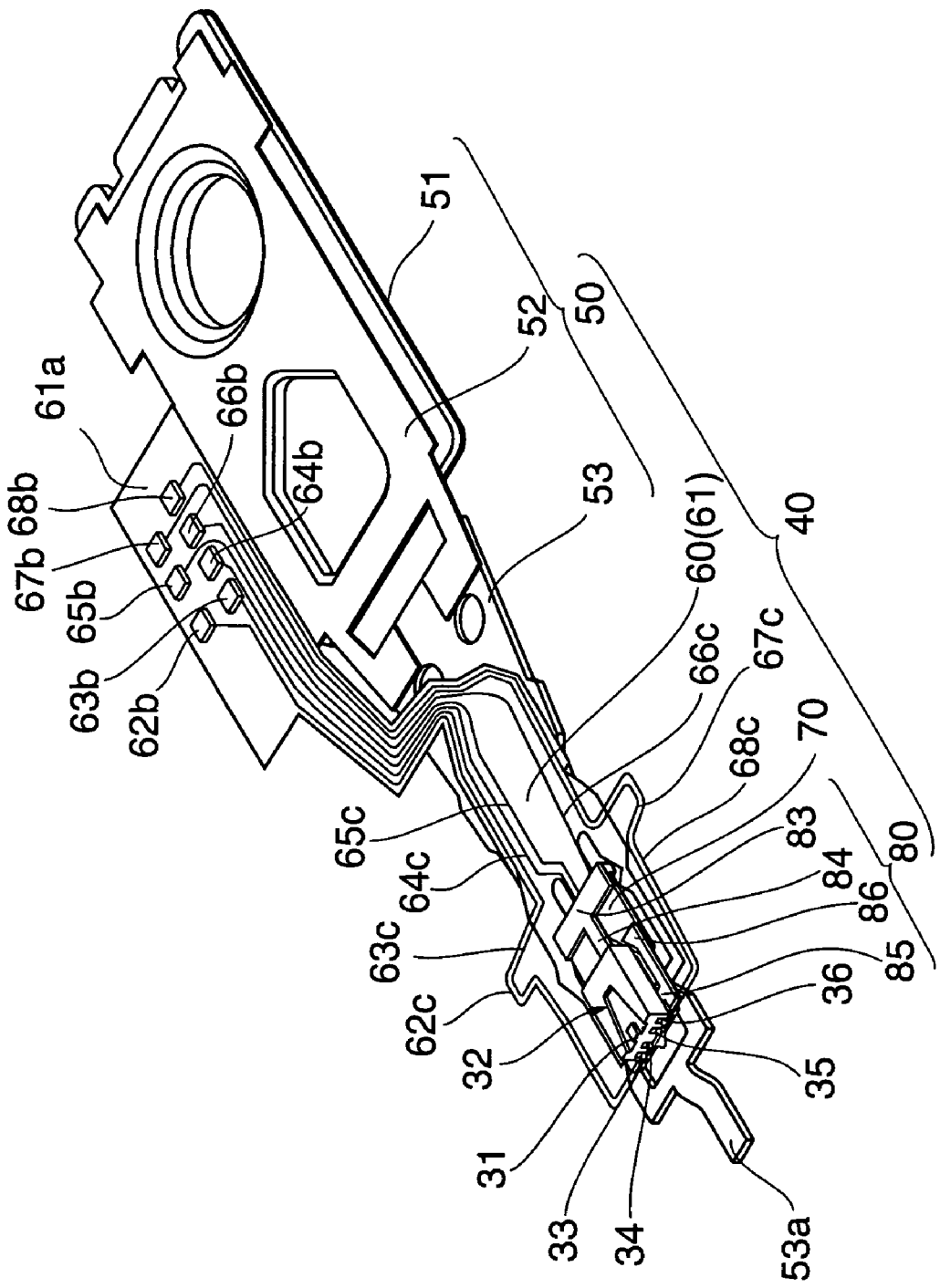
FIG. 2 is a perspective view showing a head gimbal assembly (HGA) in the embodiment of the present invention.

The electrodes 62a, 63a are connected to recording pads 33, 34, respectively, of the head slider 32. The electrodes 67a, 68a are connected to reproduction pads 35, 36, respectively. These electrodes are connected to each other by gold ball bonding as shown in FIG. 2.

The details of the thin film piezoelectric actuator 70 will be described below with reference to FIGS. 4 to 8. The thin film piezoelectric actuator 70 has a first region 70a and a second region 70b constructed to expand and contract in mutually different directions. Each region 70a, 70b is comprised of a thin film piezoelectric element of PZT or the like and the periphery thereof is coated with a resin film 77. The thin film piezoelectric element has various advantages of a lighter weight, better frequency characteristics against vibration, a wider range for installation, and controllability at a low voltage, as compared with thick film elements.

The first region 70a and the second region 70b are integrated by resin near their root but are separated from each other on the tip side where they are tapered. The outside edges of the first region 70a and the second region 70b are parallel to each other, while the inside edges thereof opposed to the outside edges expand outwardly. Furthermore, electrodes 71a, 71b to each of which a predetermined drive voltage is applied, and an electrode 71c at the ground potential are provided on the bottom side of the thin film piezoelectric actuator 70 in the drawing. These electrodes 71a, 71b, 71c are electrically connected directly, or indirectly through an electrically conductive member to the electrodes 66a, 64a, 65a on the flexure 60.

As the electrodes 71a, 71b, 71c are connected to the electrodes 66a, 64a, 65a, the root region near the electrodes 71a–71c of the thin film piezoelectric actuator 70 is bonded to the wiring substrate 61 of the flexure 60. On the other hand, the region on the tip side with respect to the root region is located in an opening region of the flexure 60, and thus faces the load beam 53.

Figure 6:
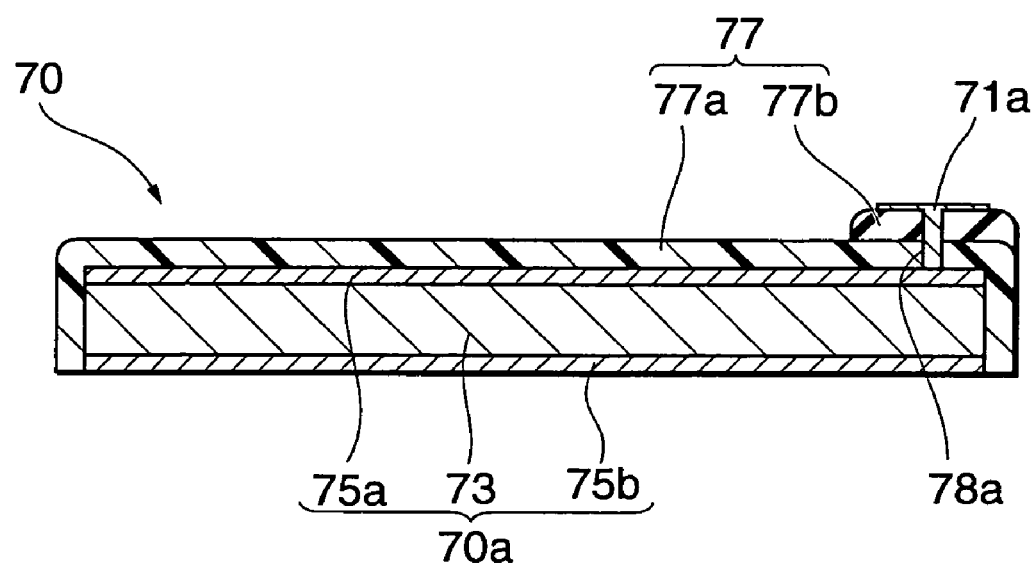
FIG. 6 is a schematic diagram showing a sectional configuration along the direction VIb—VIb in FIG. 5.
Figure 7:
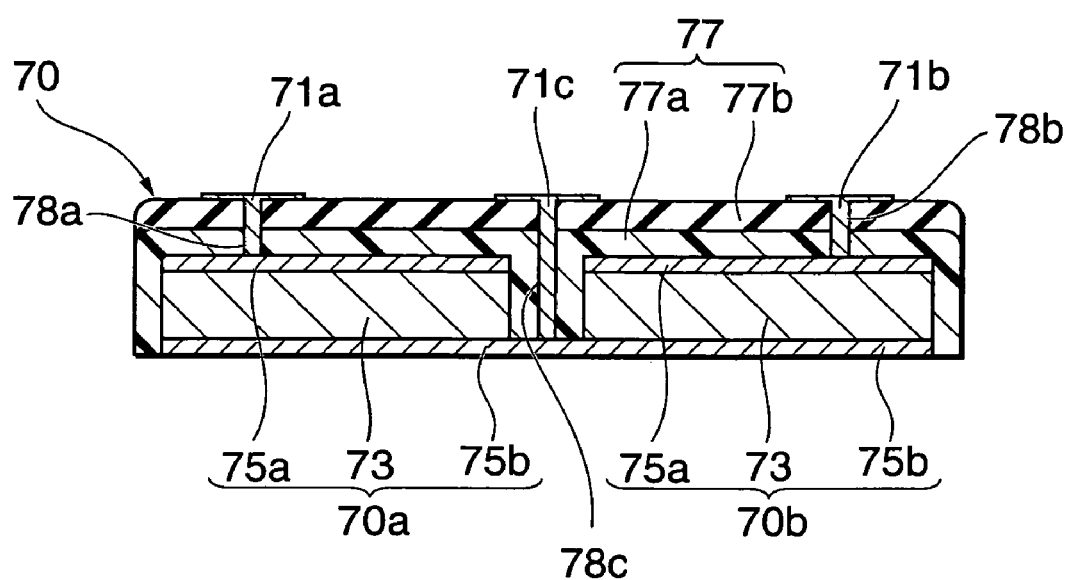
FIG. 7 is a schematic diagram showing a sectional configuration along the direction VIIb—VIIb in FIG. 5.

The first region 70a and the second region 70b each consist of a laminate including a thin film piezoelectric 73, and first and second electrode films 75a, 75b placed so as to sandwich the thin film piezoelectric 73 in between, as shown in FIGS. 6 and 7. The second electrode film 75b in the first region 70a is formed integrally with the second electrode film 75b in the second region 70b, and the second electrode film 75b is also located between the first region 70a and the second region 70b. This portion of the second electrode film 75b located between the first region 70a and the second region 70b becomes a region for extracting an electrode from the second electrode film 75b. The first region 70a and the second region 70b may also be constructed in a double layer structure in which two thin film piezoelectrics are stacked.

The resin film 77 includes a first resin film 77a and a second resin film 77b. The first resin film 77a is formed so as to cover the first region 70a and the second region 70b (the laminates each including the thin film piezoelectric 73 and the first and second electrode films 75a, 75b). The second resin film 77b is formed in the region where the electrodes 71a–71c are formed (the root region of the thin film piezoelectric actuator 70). In this configuration, the resin film 77 is formed so that the thickness of the region where the electrodes 71a–71c are formed is larger than the thickness of the region corresponding to the displaced portion of the first region 70a and the second region 70b. The resin film 77 (first resin film 77a and second resin film 77b) can be made, for example, of such a material as polyimide resin.

The electrodes 71a, 71b are formed on the second resin film 77b and electrically connected through respective contact holes 78a, 78b to the corresponding first electrode film 75a. The electrode 71c is formed on the second resin film 77b and is electrically connected through a contact hole 78c to the part of the second electrode film 75b located between the first region 70a and the second region 70b.

Figure 8:
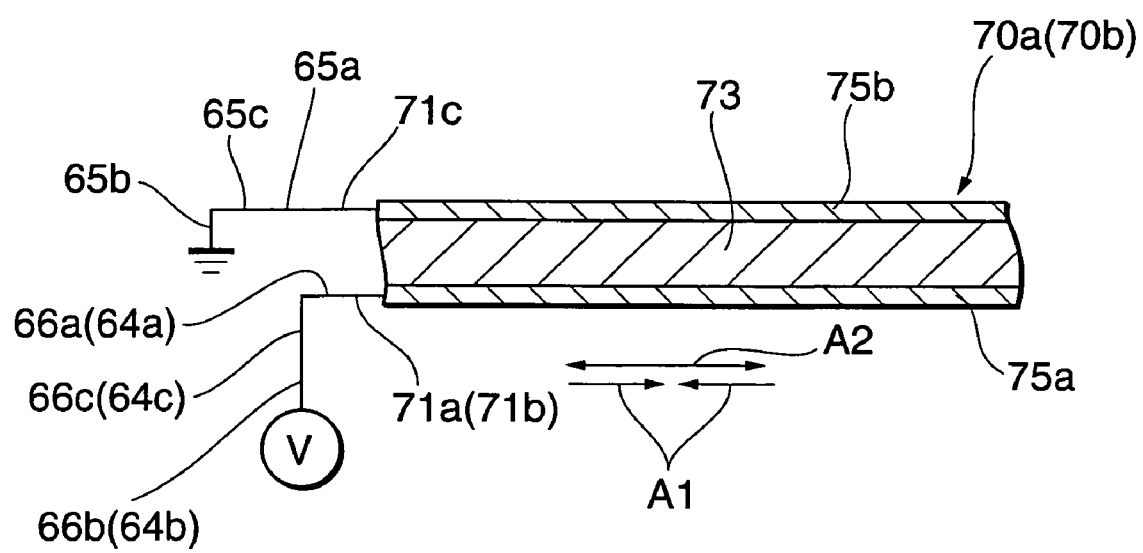
FIG. 8 is a schematic diagram for explaining a configuration of a piezoelectric actuator.

A drive voltage for driving the thin film piezoelectric 73 is applied to each of the electrodes 71a, 71b. With application of the drive voltage, as shown in FIG. 8, the thin film piezoelectric 73 expands or contracts in directions of arrows A1, A2 in accordance with the drive voltage. The drive voltages applied to the respective electrodes 71a, 71b are opposite in phase to each other, for example, with respect to the center of a bias voltage. When the positive drive voltage relative to the bias voltage is applied to the electrode 71a, the thin film piezoelectric 73 in the first region 70a contracts in the directions of arrows A1. On the other hand, when the positive drive voltage relative to the bias voltage is applied to the electrode 71b, the thin film piezoelectric 73 in the second region 70b expands in the directions of arrows A2.

Figure 14:
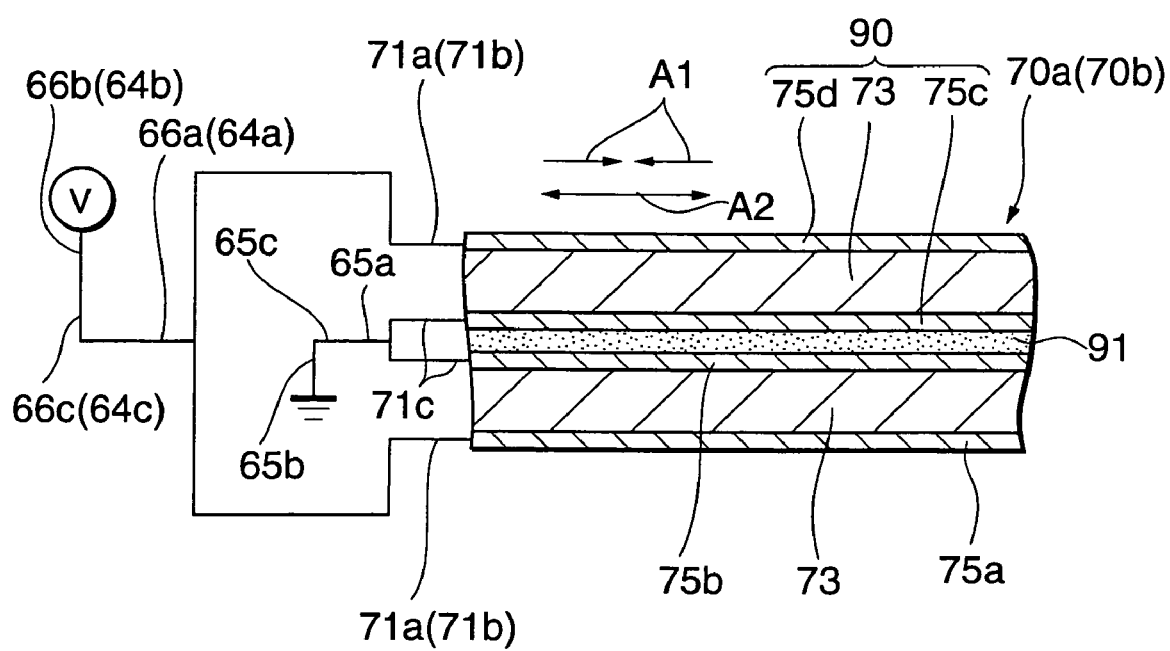
FIG. 14 is a schematic diagram for explaining a configuration of a piezoelectric actuator.

The first region 70a and the second region 70b may be formed in a double layer structure in which two thin film piezoelectrics are stacked, as shown in FIG. 14. A laminate 90 is fixed onto the second electrode film 75b with an adhesive 91. The laminate 90 includes a thin film piezoelectric 73, and a third electrode metal film 75c and a fourth electrode metal film 75d placed so as to sandwich the thin film piezoelectric 73 in between. The second electrode film 75b and the third electrode metal film 75c are bonded with the adhesive 91.

The first electrode metal film 75a and the fourth electrode metal film 75d are electrically connected to the electrode 71a. The second electrode metal film 75b and the third electrode metal film 75c are electrically connected to the electrode 71c. A drive voltage for driving each of the two thin film piezoelectrics 73 is applied to each of the electrodes. 71a, 71b. With application of the drive voltage, as shown in FIG. 14, the two thin film piezoelectrics 73 expand or contract in directions of arrows A1, A2 in accordance with the drive voltage. The drive voltages applied to the respective electrodes 71a, 71b are opposite in phase to each other, for example, with respect to the center of the bias voltage. When the positive drive voltage relative to the bias voltage is applied to the electrode 71a, the two thin film piezoelectrics 73 in the first region 70a contract in the directions of arrows A1. On the other hand, when the positive drive voltage relative to the bias voltage is applied to the electrode 71b, the two thin film piezoelectrics 73 in the second region 70b expand in the directions of arrows A2. The first region 70a and the second region 70b may also be constructed in a multilayer structure in which three or more thin film piezoelectrics are stacked.

Figure 4:
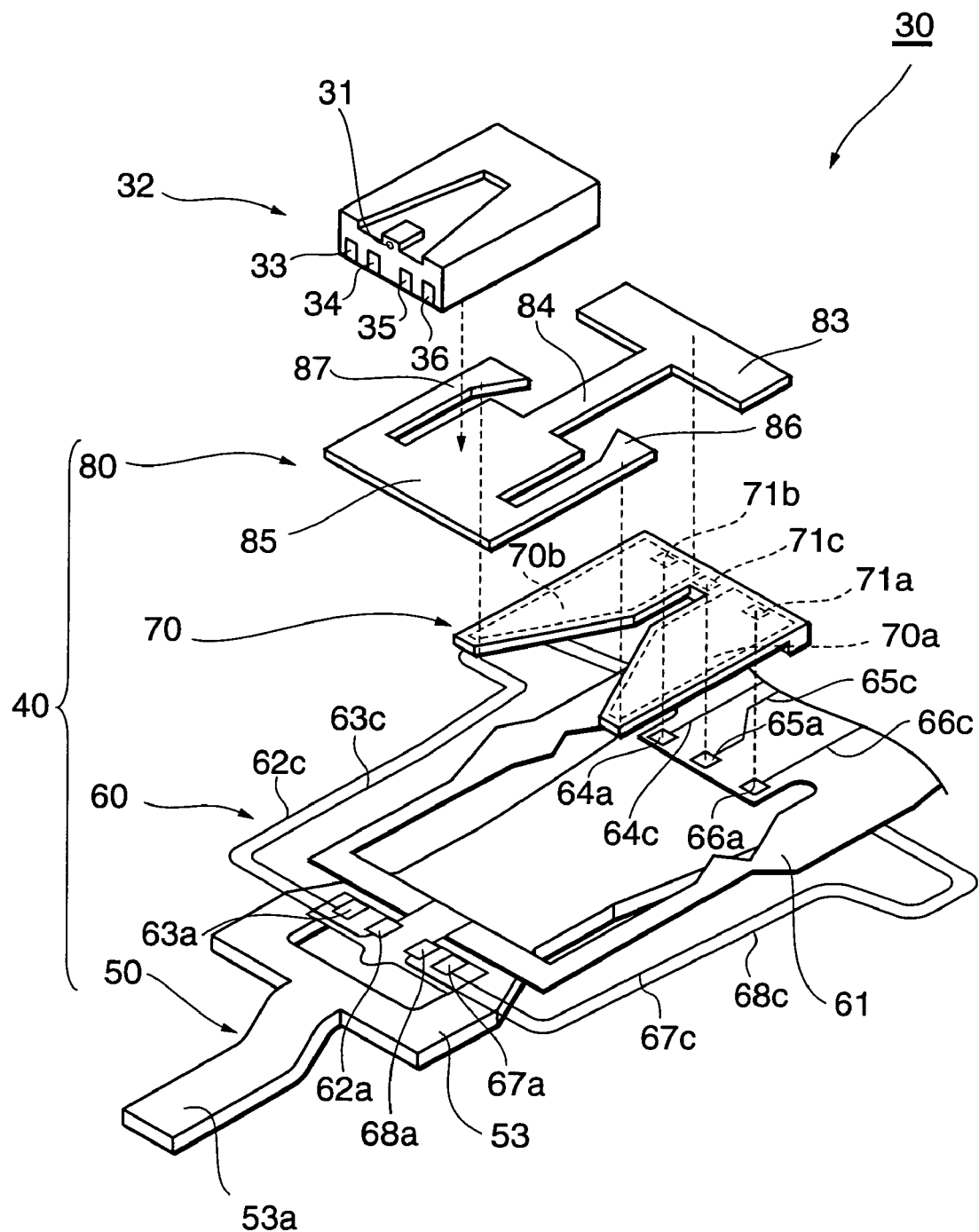
FIG. 4 is an exploded perspective view of members near the tip of a flexure in the HGA.
Figure 5:
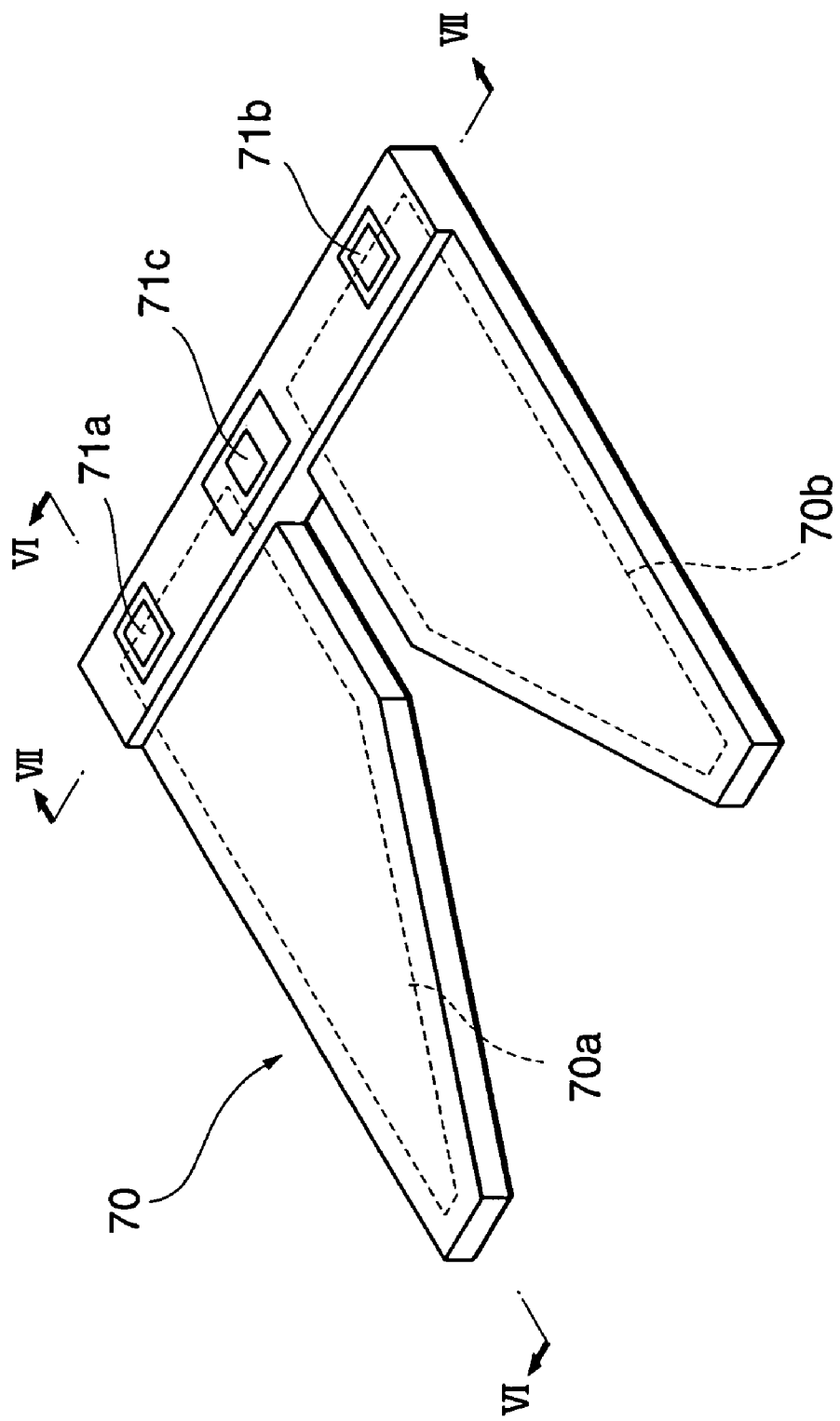
FIG. 5 is a perspective view showing a thin film piezoelectric actuator.

The transfer plate 80 transfers displacement of the thin film piezoelectric actuator 70 to the head slider 32. The transfer plate 80 has one surface (the lower surface in FIG. 4) facing the thin film piezoelectric actuator 70, and the other surface facing the head slider 32. The transfer plate 80 is made of an electrically conductive metal, e.g., stainless steel or the like, and the transfer plate 80, as also shown in FIG. 4, has a rear part 83 of rectangular shape extending in the width direction, and a front part 85 connected through a thin and long connection 84 to the rear part 83. Here the positional relation among the head slider 32, the thin film piezoelectric actuator 70, and the transfer plate 80 will be described. The head slider 32 is mounted on the front part 85 of the transfer plate 80. The thin film piezoelectric actuator 70 is located below the transfer plate 80, and is so located that the root part thereof where the electrodes 71a–71c are located overlaps the rear part 83 of the transfer plate 80 and that the tip part of the first region 70a and the second region 70b overlaps the front part 85.

Figure 9:
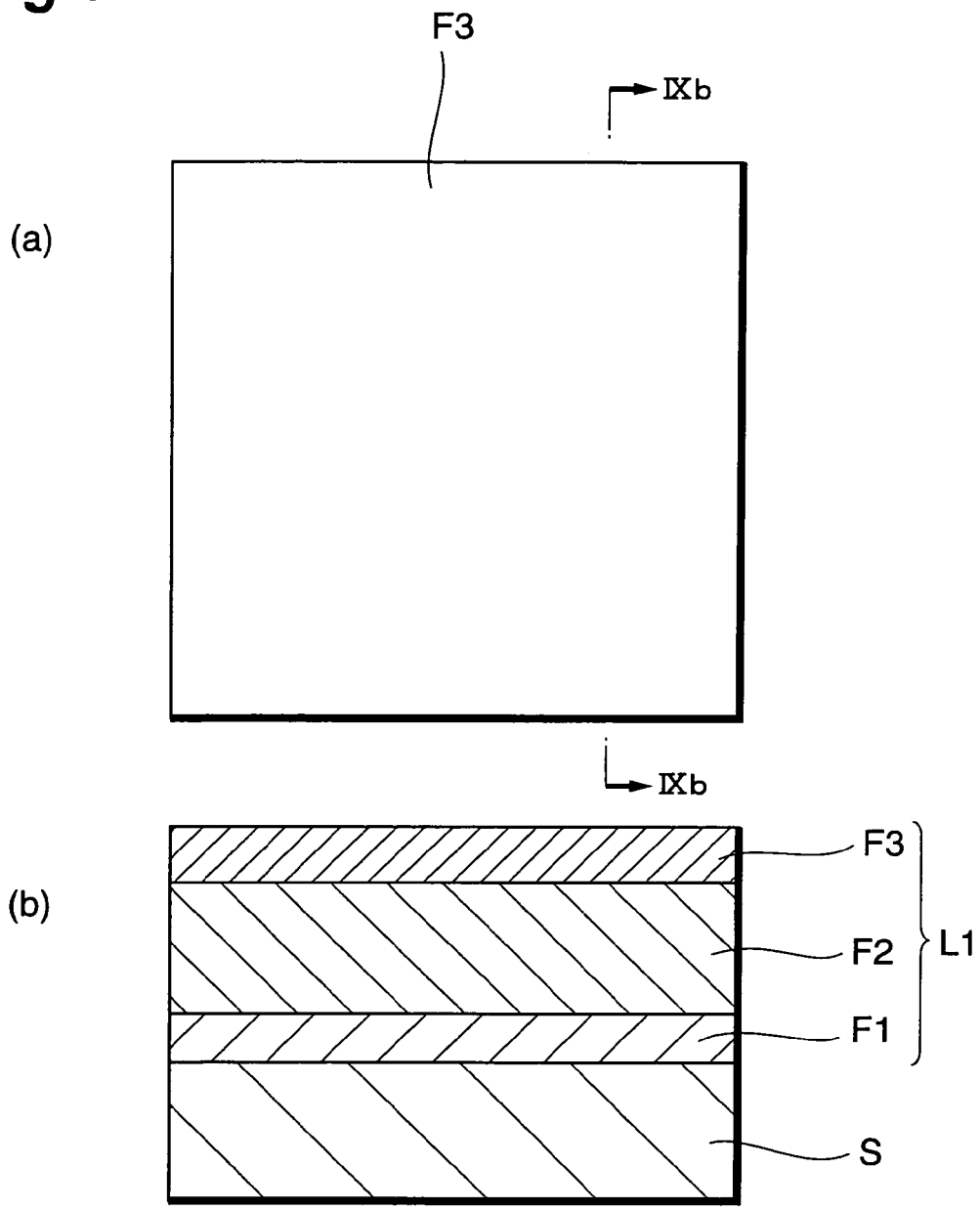
FIG. 9 is a schematic diagram for explaining a manufacturing process of a thin film piezoelectric actuator.
Figure 10:
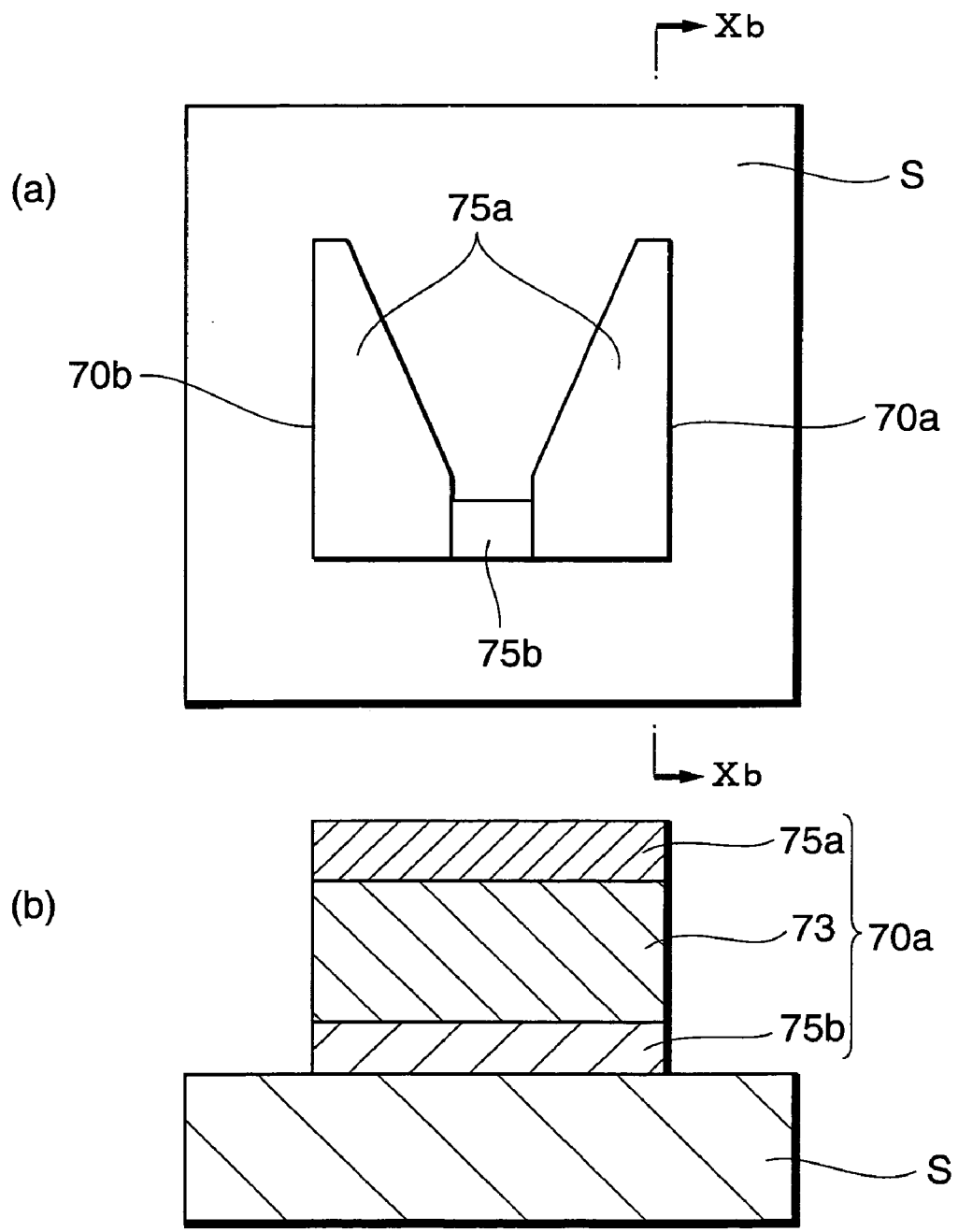
FIG. 10 is a schematic diagram for explaining the manufacturing process of the thin film piezoelectric actuator.
Figure 11:
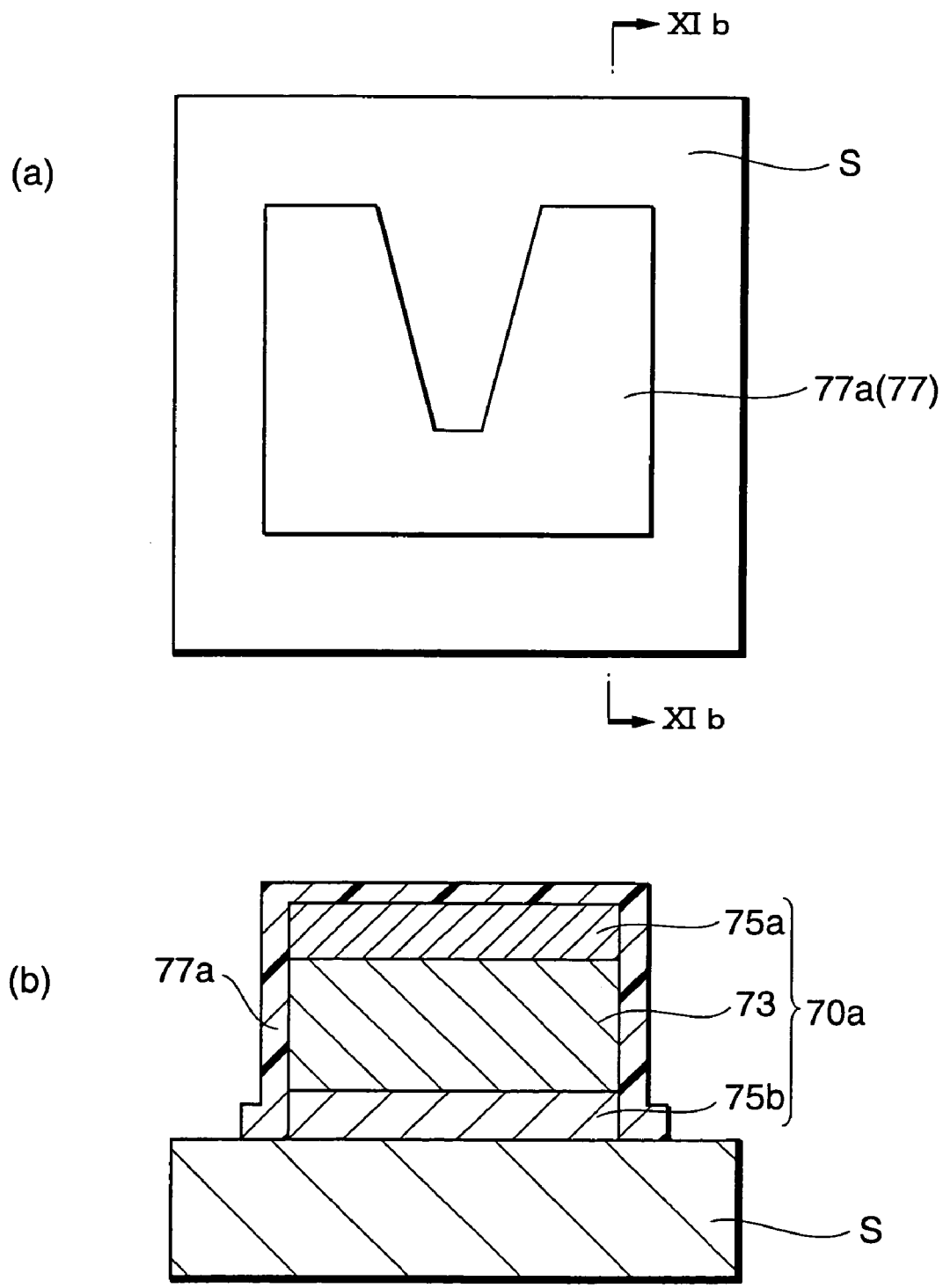
FIG. 11 is a schematic diagram for explaining the manufacturing process of the thin film piezoelectric actuator.
Figure 12:
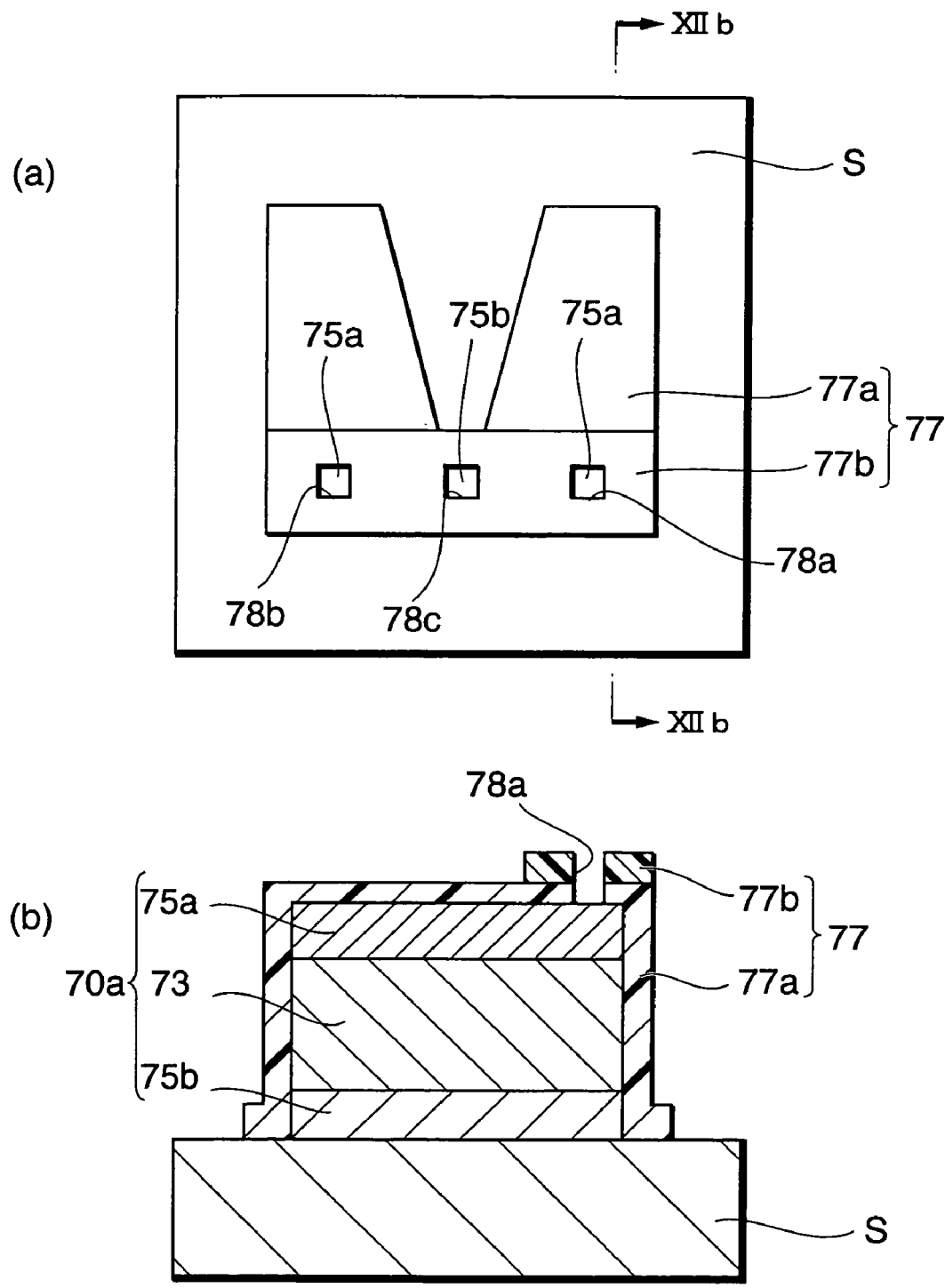
FIG. 12 is a schematic diagram for explaining the manufacturing process of the thin film piezoelectric actuator.
Figure 13:
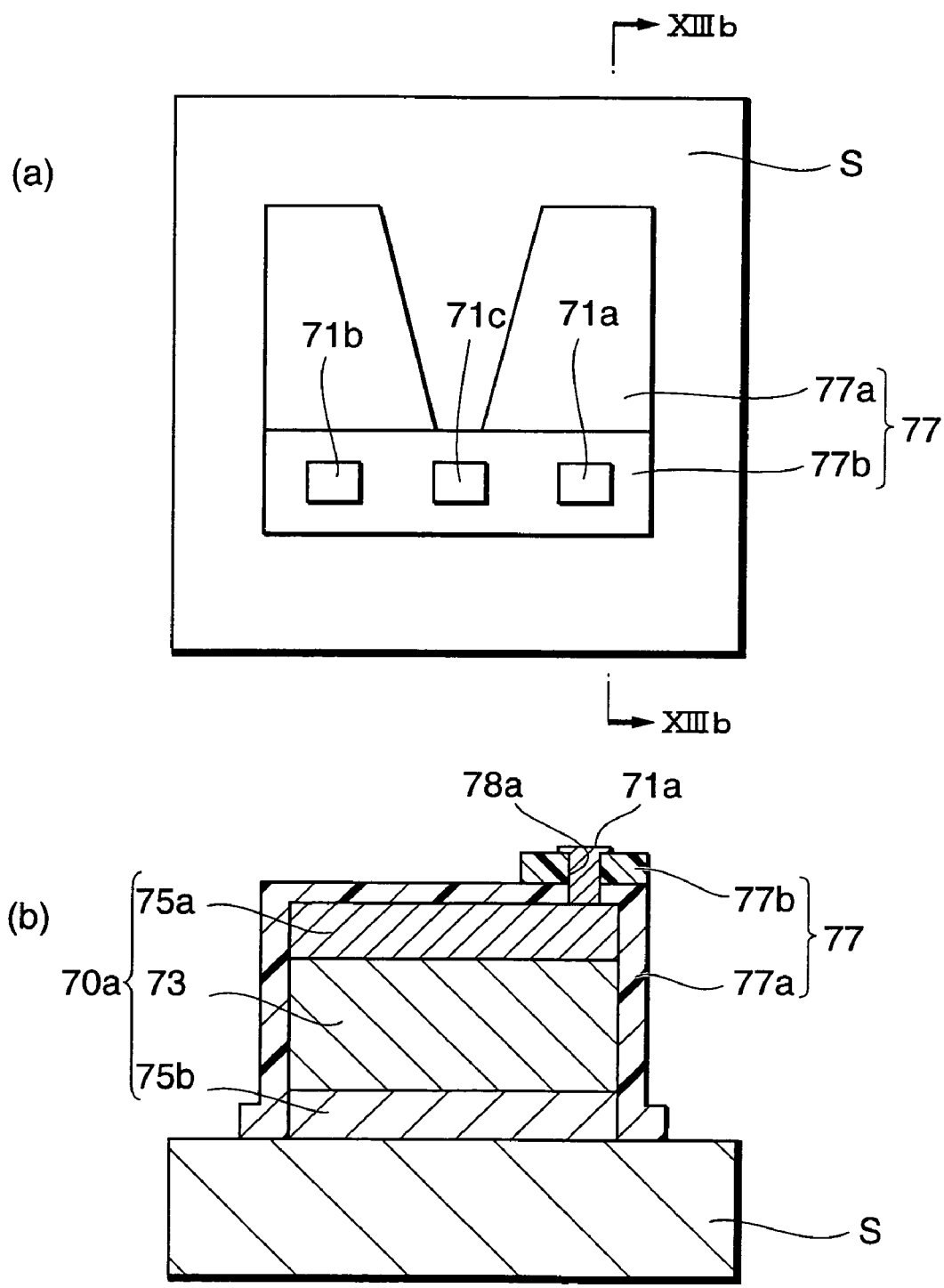
FIG. 13 is a schematic diagram for explaining the manufacturing process of the thin film piezoelectric actuator.

A manufacturing process of the thin film piezoelectric actuator 70 will be described below with reference to FIGS. 9 to 13. FIGS. 9 to 13 are schematic diagrams for explaining the manufacturing process of the thin film piezoelectric actuator. FIG. 9(b) is a schematic diagram showing a sectional configuration along the direction IXb—IXb in (a) of FIG. 9. FIG. 10(b) is a schematic diagram showing a sectional configuration along the direction Xb—Xb in (a) of FIG. 10. FIG. 11(b) is a schematic diagram showing a sectional configuration along the direction XIb—XIb in (a) of FIG. 11. FIG. 12(b) is a schematic diagram showing a sectional configuration along the direction XIIb—XIIb in (a) of FIG. 12. FIG. 13(b) is a schematic diagram showing a sectional configuration along the direction XIIIb—XIIIb in (a) of FIG. 13.

The thin film piezoelectric actuator 70 is formed according to steps (1) to (5) below.

Step (1)

First, a substrate S is prepared. Then a thin film F1 of a material forming the second electrode film 75b, a thin film F2 of a material forming the thin film piezoelectric 73, and a thin film F3 of a material forming the first electrode film 75a are deposited in the order named on this substrate S to form a laminate L1 (cf. FIGS. 9(a) and (b)). The substrate S can be, for example, a monocrystalline substrate made of magnesium oxide (MgO), or the like. The thin films F1, F3 (the first and second electrode films 75a, 75b) can be made, for example, of such metals as Pt and Ir, and such electrically conductive materials as electrically conductive oxides (e.g., IrO and others) and electrically conductive resins. The thin film F2 can be made, for example, of such a piezoelectric material as lead zirconate titanate (PZT) or barium titanate. A method of forming the thin films F1–F3 can be selected, for example, from such methods as sputtering, CVD, and laser ablation.

Step (2)

Then the laminate L1 is processed into a desired shape (patterning) (cf. (a) and (b) of FIG. 10). In this step (2), a resist film (not shown) is first formed in the portions corresponding to the first region 70a and the second region 70b, and in the portion located between the first region 70a and the second region 70b in the second electrode film 75b, on the laminate L1, and the thin films F1–F3 are removed by etching, using the resist film as a mask layer. Subsequently, the resist film is removed.

Next, again formed is a resist film (not shown) having an aperture corresponding to the portion located between the first region 70a and the second region 70b in the second electrode film 75b. Then, using this resist film as a mask layer, etching is conducted before the second electrode film 75b is exposed. Subsequently, the resist film is removed.

The above steps (1) and (2) result in forming the second electrode films 75b, the thin film piezoelectrics 73, and the first electrode films 75a in the order named on the substrate S to form the first region 70a and the second region 70b.

Step (3)

In order to avoid corrosion of the second electrode films 75b, the thin film piezoelectrics 73, and the first electrode films 75a, a first resin film 77a is then formed on the substrate S so as to cover the surfaces of the first region 70a, the second region 70b, and the portion located between the first region 70a and the second region 70b in the second electrode film 75b (cf. (a) and (b) of FIG. 11). The first resin film 77a is formed by applying a resin material forming the first resin film 77a and thereafter baking it.

Step (4)

Then a second resin film 77b is formed on the first resin film 77a and in an intended region for formation of the electrodes 71a–71c (the root region of the thin film piezoelectric actuator 70) (cf. (a) and (b) of FIG. 12). The second resin film 77b is also formed by applying a resin material forming the second resin film 77b and thereafter baking it, as the first resin film 77a was.

Then formed is a resist film (not shown) having apertures at the locations corresponding to the electrodes 71a–71c. Using this resist film as a mask layer, the resin film 77 (first resin film 77a and second resin film 77b) is removed by etching to form contact holes 78a–78c in the resin film 77 (likewise, cf. (a) and (b) of FIG. 12). Subsequently, the resist film is removed.

Step (5)

Next, again formed is a resist film (not shown) having apertures at the positions corresponding to the contact holes 78a–78c. Using this resist film as a mask layer, each of the electrodes 71a–71c is then formed by evaporation and lift-off process, on the first electrode film 75a and the second electrode film 75b exposed through the formation of the contact holes 78a–78c (cf. (a) and (b) of FIG. 13).

Thereafter, the substrate S is removed. This results in forming the thin film piezoelectric actuator 70. The removal of the substrate S can be implemented by etching with an aqueous solution of phosphoric acid (the concentration of phosphoric acid is, for example, about 30%), in a case where the substrate S is a monocrystalline substrate of MgO. In order to increase the etching rate, it is preferable to preliminarily heat the aqueous solution of phosphoric acid at about 80° C.

In a case where the thin film piezoelectric actuator is of the double layer structure in which two thin film piezoelectrics are stacked, the manufacturing process includes additional steps of preparing another substrates with a laminate L1, bonding the laminates L1 to each other with an adhesive with the thin films F3 facing each other, prior to the aforementioned step (2), and thereafter removing one of the substrates.

Subsequently, an example of an assembly process of HGA 30 will be described.

First, the flexure 60 is fixed to the load beam 53 by laser spot welding. The thin film piezoelectric actuator 70 is positioned relative to the transfer plate 80 and these are fixed with an adhesive or the like. At this time, the rear part 83 of the transfer plate 80 is bonded to the root part of the thin film piezoelectric actuator 70 with an electrically insulating adhesive or the like, and the tip portions of the first region 70a and the second region 70b are bonded to the corresponding arm portions 86, 87, respectively, with an adhesive or the like.

Then the thin film piezoelectric actuator 70 with the transfer plate 80 fixed is fixed to the flexure 60 by connecting the electrodes 71a, 71b, 71c to the electrodes 66a, 64a, 65a. The thin film piezoelectric actuator 70 is connected to the flexure 60 only at the positions of the electrodes 71a–71c (electrodes 64a–66a). Therefore, the thin film piezoelectric actuator 70 is in a floating state from the load beam 53. Then the head slider 32 is bonded to the front part 85 of the transfer plate 80, thereby obtaining the HGA 30 of the present embodiment.

The actuator arm 22 is coupled to the HGA 30 obtained as described above, to constitute the head stack assembly 20, and this is movably mounted over the hard disk 10, thereby fabricating the hard disk drive 1 of the present embodiment.

The assembly procedure of HGA 30 is not limited to that described above, but the following modification examples are also applicable. For example, an applicable procedure is to connect the thin film piezoelectric actuator 70 to the flexure 60 and thereafter fix the transfer plate 80 to the thin film piezoelectric actuator 70. Another procedure is to first assemble the head slider 32, the transfer plate 80, and the thin film piezoelectric actuator 70 together and thereafter mount the assembly on the flexure 60.

In the present embodiment, as described above, the thickness of the region where the electrodes 71a–71c are formed in the resin film 77 is larger than the thickness of the region corresponding to the displaced portion of the first region 70a and the second region 70b, and thus the space is relatively large between the first electrode film 75a and the electrodes 71a–71c, whereby it is feasible to suppress occurrence of the insulation failure between the first electrode film 75a and the electrodes 71a–71c. Since the thickness of the region corresponding to the displaced portion of the first region 70a and the second region 70b in the resin film 77 is smaller than the thickness of the region where the electrodes 71a–71c are formed, the displacement of the first region 70a and the second region 70b (thin film piezoelectric 73) is not impeded, so as to suppress the deterioration of piezoelectricity. Since the stress occurring during curing of the resin film 77 is also small, it is also feasible to suppress the warpage of the first region 70a and the second region 70b.

The resin layer 77 includes the first resin film 77a formed so as to cover the first region 70a and the second region 70b, and the second resin film 77b formed in the region where the electrodes 71a–71c are formed. This makes it extremely easy to form the resin film 77 in which the thickness of the region where the electrodes 71a–71c are formed is larger than the thickness of the region corresponding to the displaced portion of the first region 70a and the second region 70b.

The invention accomplished by Inventors was specifically described above on the basis of the embodiments thereof, but the present invention is by no means limited to the above embodiments. For example, the configuration of the thin film piezoelectric actuator 70 is not limited to the above-described layer structures. In addition, a thin film magnetic head for performing only one of recording and reproduction may also be used instead of the thin film magnetic head for performing both of the recording and reproduction with the recording medium. The head slider 32 may be directly mounted on the thin film piezoelectric actuator 70, without provision of the transfer plate 80. The thin film piezoelectric element according to the present invention is also applicable to electronic components and others except for the suspension assembly and hard disk drive in the above embodiments.

In the embodiments of the present invention, the resin film 77 is comprised of the first resin film 77a and the second resin film 77b, whereby the thickness of the region where the electrodes 71a–71c are formed is made larger than the thickness of the region corresponding to the displaced portion of the first region 70a and the second region 70b. However, the configuration of the resin film 77 does not have to be limited to this. For example, it may be comprised of a resin film formed so as to cover the region corresponding to the displaced portion of the first region 70a and the second region 70b, and a resin film formed in the region where the electrodes 71a–71c are formed, whereby the thickness of the resin film formed in the region where the electrodes 71a–71c are formed is made larger than the thickness of the resin film formed so as to cover the region corresponding to the displaced portion of the first region 70a and the second region 70b. It is also possible to thicken the region where the electrodes 71a–71c are formed, by a single resin layer 77. Furthermore, it is also possible to adopt a configuration wherein a resin film is further formed on the second resin film 77b.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A suspension assembly on which a head slider having a thin film magnetic head is to be mounted, the suspension assembly comprising:
   a flexure having a flexure electrode formed on a first surface of the flexure; and
   a thin film piezoelectric element for displacing the head slider relative to the suspension assembly,
   wherein the thin film piezoelectric element includes:
   a laminate comprising a piezoelectric film, and a pair of electrode films placed so as to sandwich the piezoelectric film in between;
   a resin film formed so as to cover the laminate; and
   a resin film electrode formed on an electrode region of a surface of the resin film and electrically connected to one of the electrode films, the electrode region of the resin film faces the first flexure surface,
   wherein the resin film is formed so that a thickness of the electrode region is larger than a thickness of a region of the resin film corresponding to a displaced portion of the laminate; and
   wherein the thin film piezoelectric element is relatively fixed to the flexure by electrically connecting the resin film electrode to the flexure electrode.

2. The suspension assembly according to claim 1, wherein the resin layer comprises a first resin film formed so as to cover the laminate, and a second resin film formed in the region where the electrode is formed.

3. The suspension assembly according to claim 1, further comprising a new laminate bonded onto the aforementioned laminate,
   wherein the new laminate comprises a piezoelectric film, and a pair of electrode films placed so as to sandwich the piezoelectric film in between.

4. A hard disk drive comprising a recording medium, a head slider having a thin film magnetic head for carrying out at least one of recording and reproduction with the recording medium, and a suspension assembly on which the head slider is mounted,
   wherein the suspension assembly includes:
   a flexure having a flexure electrode formed on a first surface of the flexure; and
   a thin film piezoelectric element for displacing the head slider relative to the suspension assembly,
   wherein the thin film piezoelectric element includes:
   a laminate comprising a piezoelectric film, and a pair of electrode films placed so as to sandwich the piezoelectric film in between;
   a resin film formed so as to cover the laminate; and
   a resin film electrode formed on an electrode region of a surface of the resin film and electrically connected to one of the electrode films, the electrode region of the resin film faces the first flexure surface, wherein the resin film is formed so that a thickness of the electrode region is larger than a thickness of a region of the resin film corresponding to a displaced portion of the laminate; and wherein the thin film piezoelectric element is relatively fixed to the flexure by electrically connecting the resin film electrode to the flexure electrode.

5. The hard disk drive according to claim 4, wherein the resin layer comprises a first resin film formed so as to cover the laminate, and a second resin film formed in the region where the electrode is formed.

6. The hard disk drive according to claim 4, further comprising a new laminate bonded onto the aforementioned laminate, wherein the new laminate comprises a piezoelectric film, and a pair of electrode films placed so as to sandwich the piezoelectric film in between.

* * * * *